(12) United States Patent
Westra et al.

(10) Patent No.: US 6,501,407 B2
(45) Date of Patent: Dec. 31, 2002

(54) DIGITAL TO ANALOG CONVERTER

(75) Inventors: Jan Roelof Westra, Amstelveen (NL); Anne Johan Annema, Eindhoven (NL); Jeroen Michiel Van Den Boom, Nijmegen (NL); Eise Carel Dijkmans, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/962,652

(22) Filed: Sep. 25, 2001

(65) Prior Publication Data
US 2002/0047795 A1 Apr. 25, 2002

(30) Foreign Application Priority Data
Sep. 27, 2000 (EP) .............................................. 00203337

(51) Int. Cl.$^7$ ................................................. H03M 1/66
(52) U.S. Cl. ........................ 341/144; 341/118; 341/119; 341/120; 341/143
(58) Field of Search .................................. 341/118, 119, 341/144, 120, 143

(56) References Cited
U.S. PATENT DOCUMENTS

| | | | | |
|---|---|---|---|---|
| 5,079,552 A | * | 1/1992 | Pelgrom et al. | 341/144 |
| 5,134,398 A | * | 7/1992 | Yasutake et al. | 341/119 |
| 5,612,696 A | * | 3/1997 | Kim | 341/136 |
| 6,184,813 B1 | * | 2/2001 | Abughazaleh et al. | 341/144 |
| 6,198,418 B1 | * | 3/2001 | Ishizuka | 341/126 |
| 6,222,473 B1 | * | 4/2001 | Castaneda et al. | 341/144 |
| 6,337,648 B1 | * | 1/2002 | Kiriaki | 341/144 |
| 6,344,813 B1 | * | 2/2002 | Pingel et al. | 341/144 |
| 6,344,815 B2 | * | 2/2002 | Ureshino | 341/144 |

* cited by examiner

Primary Examiner—Michael Tokar
Assistant Examiner—Linh Van Nguyen
(74) Attorney, Agent, or Firm—Aaron Waxler

(57) ABSTRACT

A digital to analog converter (DAC) for converting a digital signal (DS) having a maximum voltage range which corresponds to a first supply voltage ($U_L$) into an analog signal ($U_{out}$) having a maximum voltage range which corresponds to a second supply voltage ($U_H$). The first supply voltage ($U_L$) is offered between a first supply terminal ($V_{SS}$) and a second supply terminal ($V_{DDL}$). The second supply voltage ($U_H$) is offered between the first supply terminal ($V_{SS}$) and a third supply terminal ($V_{DDH}$). The digital to analog converter (DAC) comprises conversion resistors ($R_{CNV0}$–$R_{CNVn}$) and coupling means (CPL) for coupling a number of said conversion resistors ($R_{CNV2}$–$R_{CNVn}$) in between the first supply terminal ($V_{SS}$) and an output terminal (OUT), and for coupling the remainder of said conversion resistors ($R_{CNV0}$–$R_{CNV1}$) in between the third supply terminal ($V_{DDH}$) and the output terminal (OUT). The value of said number depends on the data content of the digital signal (DS). Digital to analog converters are generally implemented in ICs. For modern ICs there is a trend toward ever decreasing supply voltages. Often circuits implemented in new IC processes have to be able to interface with ICs processed in less modern processes which are generally operated on higher supply voltages. In the modern process, therefore, circuits designed in modern ICs have to cope with voltages which are above the maximum specification for their transistors or other components. The DA-converter (DAC) mentioned above fulfils this requirement by the fact that material, such as polycrystalline silicon, is used for the conversion resistors ($R_{CNV}2$–$R_{CNVn}$), which material can cope with relatively high voltages, and furthermore by the fact that only the coupling means (CPL) have to be designed to cope with relatively high voltages.

22 Claims, 12 Drawing Sheets

DIGITAL TO ANALOG CONVERTER

FIELD OF THE INVENTION

The invention relates in general to an electronic circuit designed for receiving a first supply voltage between a first supply connection terminal and a second supply connection terminal and for receiving a second supply voltage between the first supply connection terminal and a third supply connection terminal, comprising a DA converter for converting a digital signal with a voltage range which is at most equal to the first supply voltage into an analog signal with a voltage range which is at most equal to the second supply voltage, and more in particular to DA converters in integrated circuits or ICs.

BACKGROUND OF THE INVENTION

Such electronic circuits are known from the general prior art. The general trend is towards designing ICs which operate at increasingly lower supply voltages. This has the result inter alia that the analog signal supplied by the DA converter has an ever smaller amplitude. This is because the peak-to-peak value of the analog signal cannot be greater than the value of the supply voltage. The lower maximum vale of the analog signal will also adversely affect the signal-to-noise ratio of the analog signal. Another disadvantage is that these modem ICs will have to deal with voltages higher than the maximum admissible operating voltages for modem ICs because they have to be able to communicate with ICs of older types, which operate at higher supply voltages. The latter problem is solved in the prior art in that the core of the DA converter in the modern IC is supplied from the comparatively low first supply voltage, and in that furthermore an amplifier is coupled behind the DA converter, which is connected to the comparatively high second supply voltage. The output of the amplifier then delivers an analog signal which ha a hither amplitude than the analog signal at the direct output of the DA converter. The amplifier must be designed such that it can cope with the higher second supply voltage. The signal-to-noise ratio mentioned above, however, is not improved thereby because the analog signal level at the direct output of the DA converter, i.e. at the input of the amplifier, is still limited by the value of the lower first supply voltage.

SUMMARY OF THE INVENTION

It is accordingly an object of the invention to provide an electronic circuit with a DA convener, which DA converter is capable of communicating with other electronic circuits which are supplied with a higher supply voltage, and which DA converter delivers an analog output signal with an improved signal-to-noise ratio.

According to the invention, the electronic circuit mentioned in the opening paragraph is for this purpose characterized in that the DA converter comprises: conversion resistors and coupling means for coupling a number of said conversion resistors between the first supply connection terminal and an output terminal of the DA converter, and for coupling the remaining number of conversion resistors between the third supply terminal and the output terminal, said number being dependent on the data content of the digital signal. In contrast to the prior art, the conversion resistors are coupled to the third supply connection terminal for receiving the second, comparatively high supply voltage, so that the analog signal at the output of the DA converter is no longer limited by the comparatively low first supply voltage. As a result, an analog signal with an enhanced amplitude level can be delivered at the direct output of the DA converter. The signal-to-noise ratio of the analog signal can thus be higher.

A further advantage of the electronic circuit according to the invention is that only the coupling means need be constructed such that they are resistant to the comparatively high second supply voltage, because resistors which can cope with a comparatively high voltage may be used as the conversion resistors. The resistors may be manufactured from, for example, polycrystalline silicon.

An embodiment of an electronic circuit according to the invention is characterized in that the coupling means comprise drivers which are coupled between the first supply connection terminal and the third supply connection terminal, and in that each conversion resistor is coupled by a first connection point to the output terminal and by a second connection point separately to an output of the associated separate driver.

Each separate driver is constructed such that it comprises no components across which a potential difference can arise higher than the maximum admissible IC process voltage, in spite of the fact that the separate driver is supplied from a comparatively high supply voltage which is higher than the process supply voltage of the IC process in which the separate driver is implemented.

Advantageous embodiments of said driver are defined in claims 3 to 10.

An embodiment of an electronic circuit is characterized in that the DA converter comprises a separate digital voltage level shifter for each driver, with a first supply connection point which is coupled to the first supply connection terminal, with a second supply connection point which is coupled to the second supply connection terminal, with a third supply connection point which is coupled to the third supply connection terminal, with a first output which is coupled to the input of the first buffer, with a second output which is coupled to the input of the second buffer, and with an input, and in that the DA converter in addition comprises synchronization means for synchronizing the data bits of the digital signal, separate inputs of the synchronization means being coupled so as to receive the separate data bits, while the synchronization means have a clock input for receiving a clock signal, and the synchronization means have separate outputs which are coupled to the separate inputs of the separate digital voltage level shifters.

The separate voltage shifters in this embodiment ensure that the first buffers and the second buffers are controlled with signals having the desired voltage levels. The synchronization means ensure that the data bits are read substantially simultaneously under the control of the clock signal.

An embodiment of an electronic circuit according to the invention is characterized in that the DA converter comprises a separate digital voltage level shifter for each driver, with a first supply connection point which is coupled to the first supply connection terminal, with a second supply connection point which is coupled to the second supply connection terminal, with a third supply connection point which is coupled to the third supply connection terminal, with a first output, with a second output, and with an input, the separate inputs of the voltage level shifters being coupled so as to receive the separate data bits of the digital signal, and in that the DA converter in addition comprises synchronization means for synchronizing the data bits, separate inputs of the synchronization means being coupled to the separate first outputs and the separate second outputs of the voltage level shifters, which synchronization means have a clock input for receiving a clock signal, and which synchronization means have separate outputs which are coupled to the separate first inputs of the first buffers and the separate second inputs of the second buffers. This is an alternative version of the preceding embodiment. The synchronization means are now situated not upstream of the level shifters, but in between the level shifters and the buffers.

Advantageous embodiments of the voltage level shifters mentioned above are defined in claims 13 to 16.

An embodiment of an electronic circuit according to the invention is characterized in that the electronic circuit comprises a current compensation circuit which is connected between the first supply connection terminal and the third supply connection terminal for receiving the second supply voltage, which current compensation circuit in the operational state is controlled from the digital signal in a manner such that the sum of the current consumption of the DA converter and the current consumption of the current compensation circuit is substantially independent of the data content of the digital signal. The current drawn by the DA converter is dependent on the data content of the digital signal. A certain wiring impedance is always present in series with the supply lines of the DA converter (ohmic resistance and self-inductance). Owing to the presence of this wiring impedance and owing to the fact that the power consumed by the DA converter is dependent on the data content of the digital signal, the DA converter is supplied with a voltage which contains a data-dependent component. Since the so-called Power Supply Rejection Ratio of the DA converter is comparatively low, a distortion of signals will arise in the DA converter in dependence on the value of this Power Supply Rejection Ratio. An undesirable signal crosstalk to other components of the electronic circuit may also arise.

Both the DA converter and the current compensation circuit have a data-dependent current consumption. The data-dependent component of the current consumption of the current compensation circuit has the same value as the data-dependent component of the current consumption of the DA converter. The two said current components, however, are mutually in counterphase. Since the supply connection points of the DA converter and of the current compensation circuit are connected to one another by means of very short wiring portions, substantially no data-dependent current will flow through said wiring impedances. This is because the data-dependent component of the DA converter and the data-dependent component of the current compensation circuit compensate one another. The result of this is that the DA converter is supplied with a supply voltage which is substantially independent of the data content of the digital signal. Signal distortion and signal crosstalk are thus avoided, even at a low Power Supply Rejection Ratio.

Advantageous embodiments of current compensation circuits according to the invention are specified in claims 19 to 22.

BRIEF DESCRIPTION OF THE DRAWING

The invention will now be explained in more detail with reference to the accompanying drawing, in which.

DETAILED DESCRIPTION OF THE PRIMARY EMBODIMENT

The same components or elements have been given the same reference symbols in these Figures.

Figure 1:
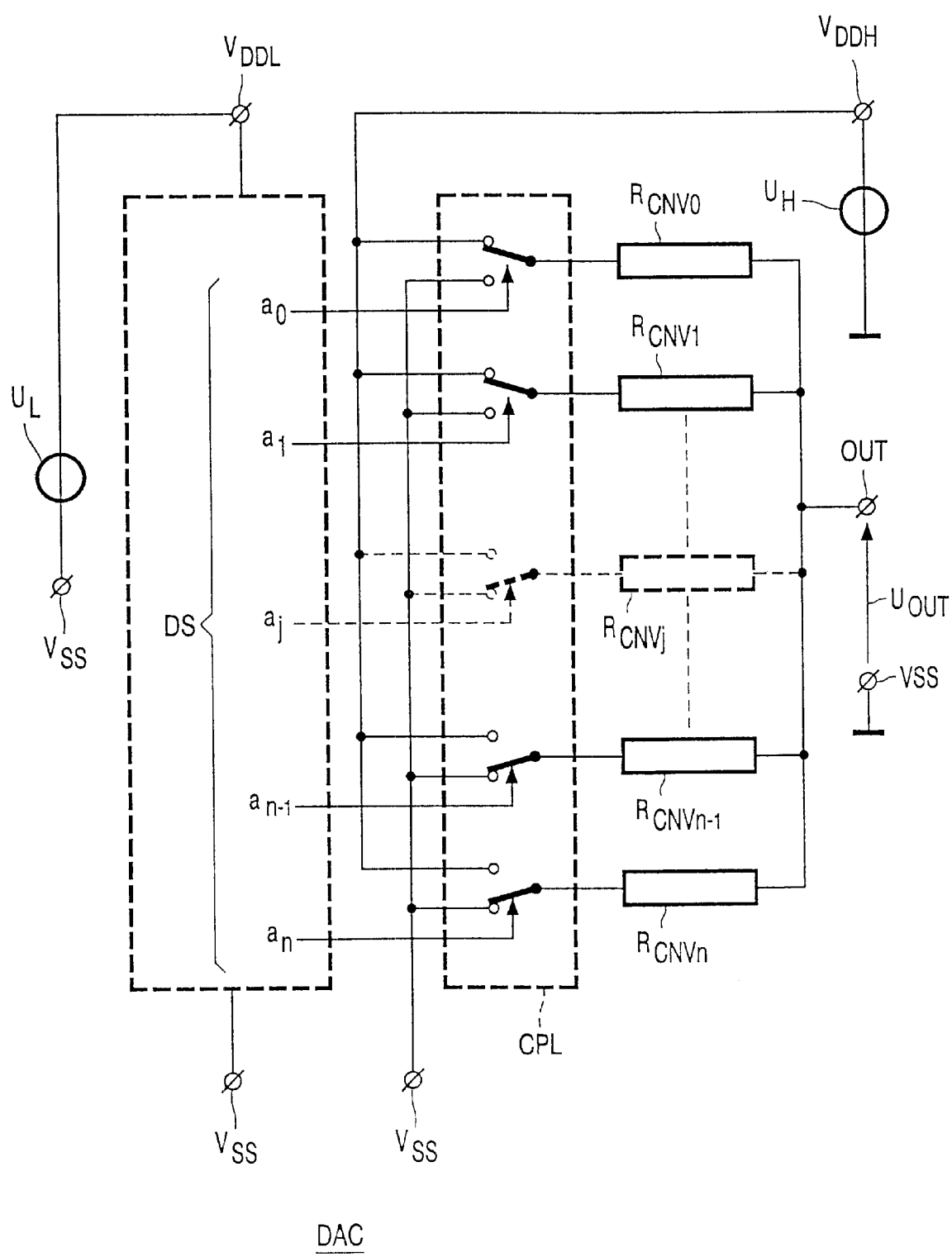
FIG. 1 is a circuit diagram of an embodiment of an electronic circuit according to the invention.

FIG. 1 is a circuit diagram of an embodiment of an electronic circuit with a DA converter DAC. The DA converter DAC comprises coupling means CPL and conversion resistors $R_{CNVn}$ to $R_{CNVn}$. The coupling means CPL comprise switches which are controlled by the digital signals DS which are referenced $a_0$ to $a_n$. The DA converter DAC delivers an analog output signal UOUT between the output terminal OUT and a first supply connection terminal $V_{SS}$. The DA converter DAC is implemented in an IC which operates on a first supply voltage $U_L$ present between the first supply connection terminal $V_{SS}$ and a second supply connection terminal $V_{DDL}$. FIG. 1 also shows a third supply connection terminal $V_{DDH}$ which is to receive a second supply voltage which is present between the first supply connection terminal $V_{SS}$ and the third supply connection terminal $V_{DDH}$. Depending on the logic value of the signals $a_0$ to $a_n$, the conversion resistors are connected either between the first supply connection terminal $V_{SS}$ and the output terminal OUT, or between the third supply connection terminal $V_{DDH}$ and the output terminal OUT. FIG. 1 shows by way of example the situation in which the conversion resistors $R_{CNV0}$ and $R_{CNV1}$ are connected between the third supply connection terminal $V_{DDH}$ and the output terminal OUT. The remaining conversion resistors are connected between the first supply connection terminal $V_{SS}$ and the output terminal OUT. The conversion resistors may be manufactured from, for example, polycrystalline silicon. The second supply voltage $U_H$ may be higher than the maximum admissible IC process voltage of the IC. The coupling means CPL, however, are designed such that they do not comprise any components across which a potential difference arises in excess of the maximum admissible IC process voltage. The analog signal $U_{OUT}$ has a voltage range substantially equal to the second supply voltage $U_H$. As a result, the signal-to-noise ratio of the analog signal $U_{OUT}$ will be greater than in a similar circuit according to the prior art, in which the voltage range of the analog signal $U_{OUT}$ is equal to the first supply voltage $U_L$.

Figure 2:
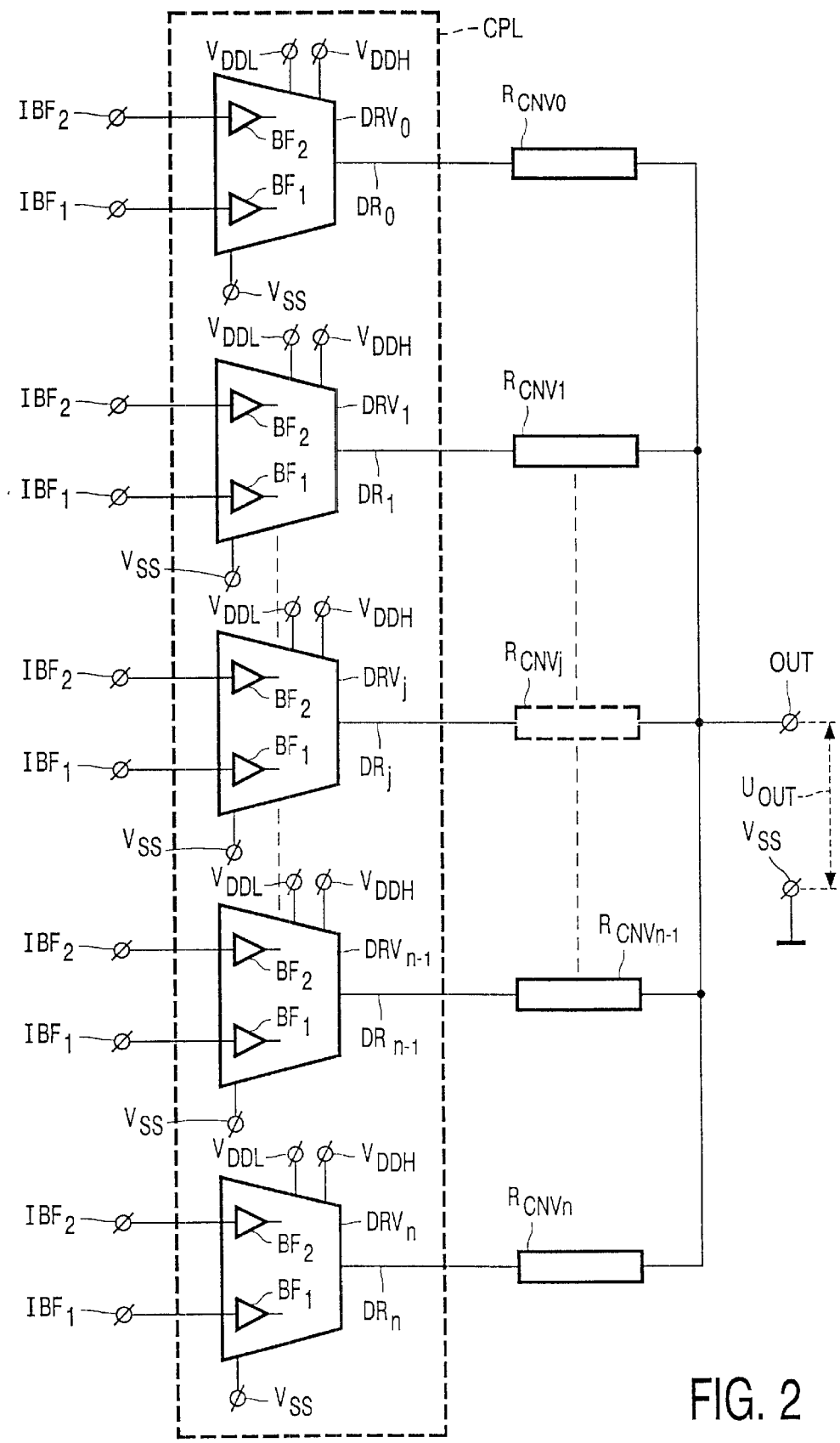
FIG. 2 is a circuit diagram of a further embodiment of an electronic circuit according to the invention.

FIG. 2 is a circuit diagram of a further embodiment of the DA converter DAC. The coupling means are implemented with the drivers $DR_o$ to $DR_n$. Each driver $DR_j$ has a first supply connection point which is coupled to the first supply connection terminal $V_{SS}$, a second supply connection point which is coupled to the second supply connection terminal $V_{DDL}$, and a third supply connection point which is coupled to the third supply connection terminal $V_{DDH}$. Each driver DRV$_J$ has an output DR$_j$ which is coupled to the corresponding conversion resistor R$_{CNVj}$. Each driver DRV$_j$ has a first buffer BF$_1$ with an input IBF$_1$ and a second buffer BF$_2$ with a second input IBF$_2$. Depending on the logic levels at the inputs IBF$_1$ and IBF$_2$, which levels are defined by the data bits a$_0$ to a$_n$ of the digital signal DS (see FIG. 1), the potential at an output DR$_j$ will be either substantially equal to the potential at the first supply connection terminal V$_{SS}$ or substantially equal to the potential at the third supply connection terminal V$_{DDH}$.

Figure 3:
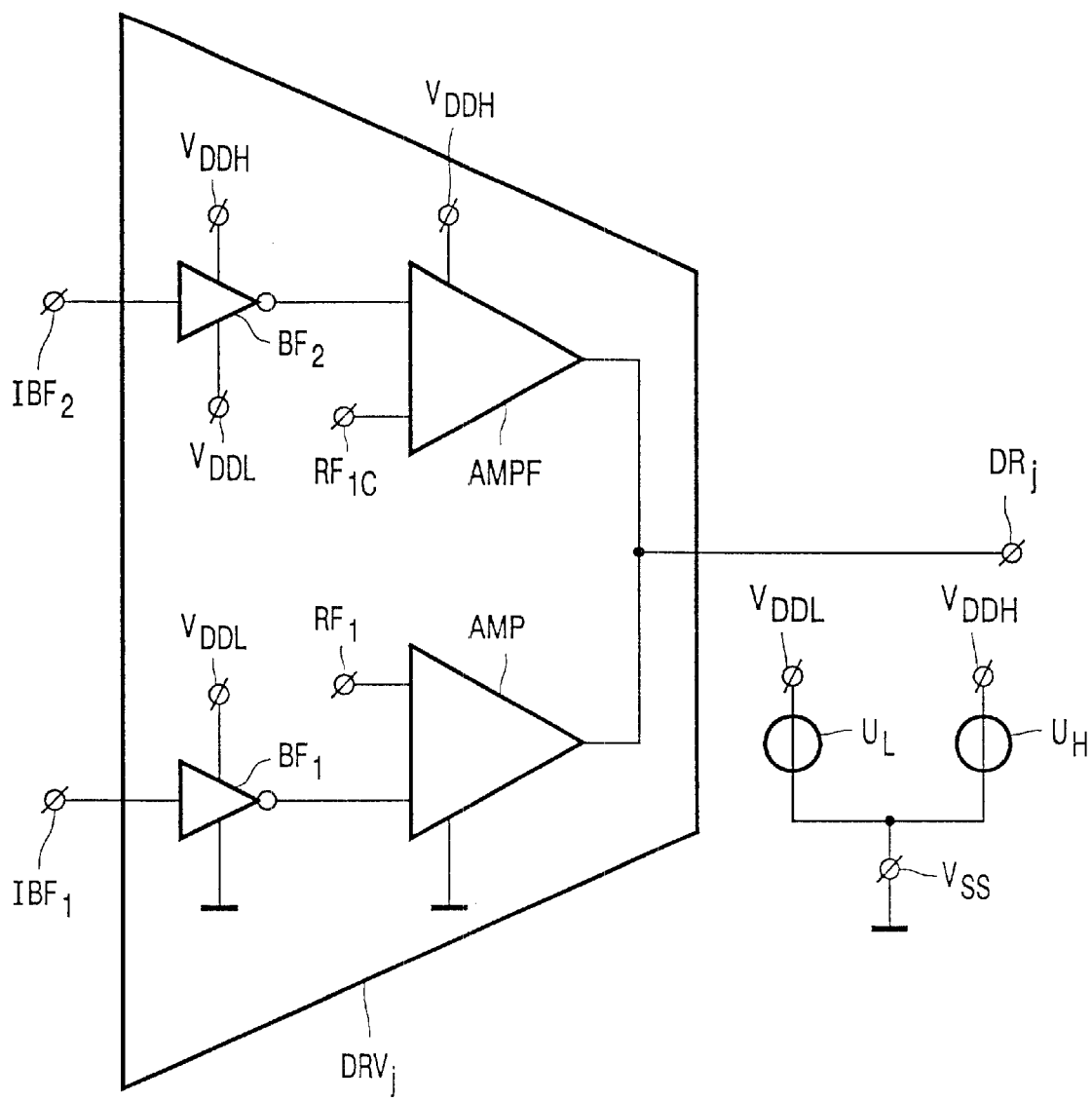
FIG. 3 is a circuit diagram of a driver for use in the electronic circuit according to the invention.

FIG. 3 is a circuit diagram of a driver DRV$_J$ for use in the electronic circuit of FIG. 2. The driver DRV$_J$ comprises an amplifier stage AMP, a further amplifier stage AMPF, the first buffer BF$_1$, and the second buffer BF$_2$. The outputs of the amplifier stages AMP and AMPF are interconnected and together form the output DR$_j$. A first supply connection point of the amplifier stage AMP is connected to the first supply connection terminal V$_{SS}$. A supply connection point of the further amplifier stage AMPF is connected to the third supply connection terminal V$_{DDH}$. The supply connection points of the first buffer BF$_1$, are connected between the first supply connection terminal V$_{SS}$ and the second supply connection terminal V$_{DDL}$. The supply connection points of the second buffer BF$_2$ are connected between the second supply connection terminal V$_{DDL}$ and the third supply connection terminal V$_{DDH}$. The outputs of the buffers BF$_1$ and BF$_2$ are connected to inputs of the amplifier stages AMP and AMPF, respectively. The amplifier stage AMP has a reference terminal RF$_1$ for receiving a reference voltage. The further amplifier stage AMPF has a reference terminal RF$_{1C}$ for receiving a further reference voltage. The buffers BF$_1$ and BF$_2$ are implemented as inverters, by way of example. Let us now assume, for example, that the potential at the first supply connection terminal is equal to 0 volt, that the first supply voltage U$_L$ is equal to 2.5 volts, and that the second supply voltage U$_H$ is equal to 5 volts. The logic low and high values at the input of the amplifier stage AMP will then be 0 volt and 2.5 volts, respectively. The logic low and high values at the input of the further amplifier stage AMPF will then be 2.5 volts and 5 volts, respectively. The construction of the amplifier stages AMP and AMPF is such that a potential difference greater than 2.5 volts will not be present anywhere in the driver DRV$_J$, in spite of the fact that there is a potential of 5 volts at the third supply connection terminal. As a result, the driver can be incorporated in an IC with a maximum IC process voltage of 2.5 volts, while nevertheless the voltage range at the output DR$_j$ is 5 volts.

Figure 4:
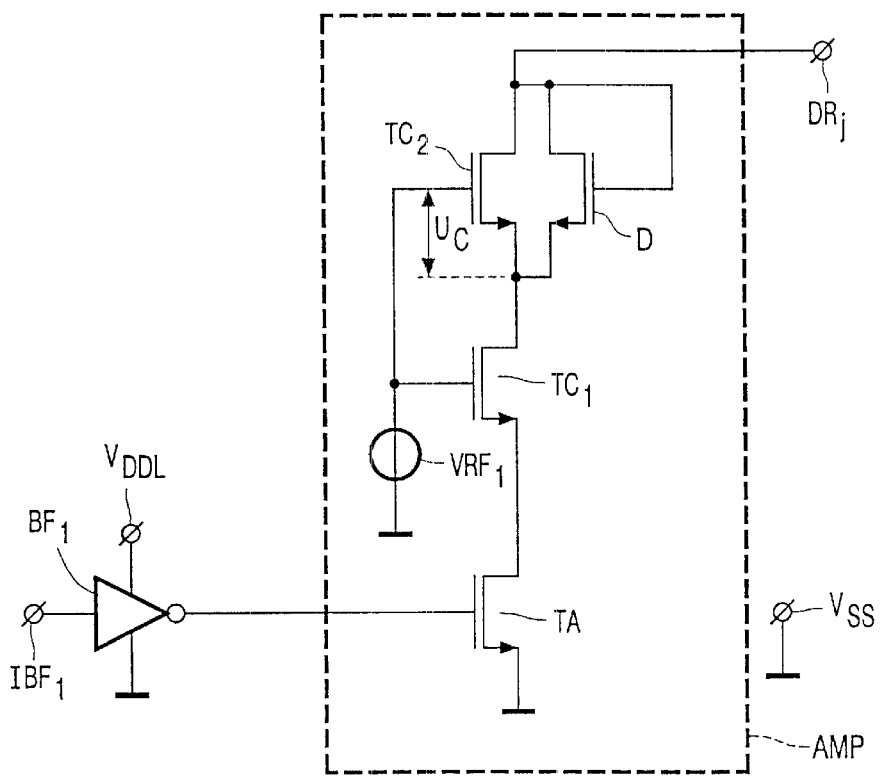
FIGS. 4 to 9 are circuit diagrams of amplifiers for use in the drivers of an electronic circuit according to the invention.

FIG. 4 is a circuit diagram of an embodiment of the amplifier stage AMP. The amplifier stage AMP comprises an amplifier transistor TA, a first cascode transistor TC$_1$, a second cascode transistor TC$_2$, and a transistor D connected as a diode. The amplifier transistor TA is connected by a gate to the output of the first buffer BF$_1$ and by a source to the first supply connection terminal V$_{SS}$. The first cascode transistor TC$_1$ is connected by a gate to a reference voltage source VRF$_1$ and by a source to the drain of the amplifier transistor TA. The second cascode transistor TC$_2$ is connected by a gate to the gate of the first cascode transistor TC$_1$, by a source to the drain of the first cascode transistor TC$_1$, and by a drain to the output DR$_j$. The diode D is connected in parallel to the main current path of the second cascode transistor TC$_2$. The control voltage Uc between the gate and the source of the second cascode transistor TC$_2$ is adapted in dependence on the potential at the gate of the amplifier transistor TA and the potential at the output DR$_j$, also partly because of the transistor D connected as a diode. As a result, no voltage differences across the transistors in the amplifier stage AMP are greater than 2.5 volts, while nevertheless the voltage amplitude at the output DR$_j$ can be as high as 5 volts. All this is subject to the condition that a suitable value is chosen for the voltage delivered by the reference voltage source VRF$_1$, for example equal to the value of the potential at the second supply connection terminal V$_{DDL}$, i.e. 2.5 volts in the present example.

This means that the reference voltage source VRF$_1$ may be left out, if so desired, in which case the gates of the cascode transistors TC$_1$ and TC$_2$ are connected to the second supply voltage terminal V$_{DDL}$.

Figure 5:
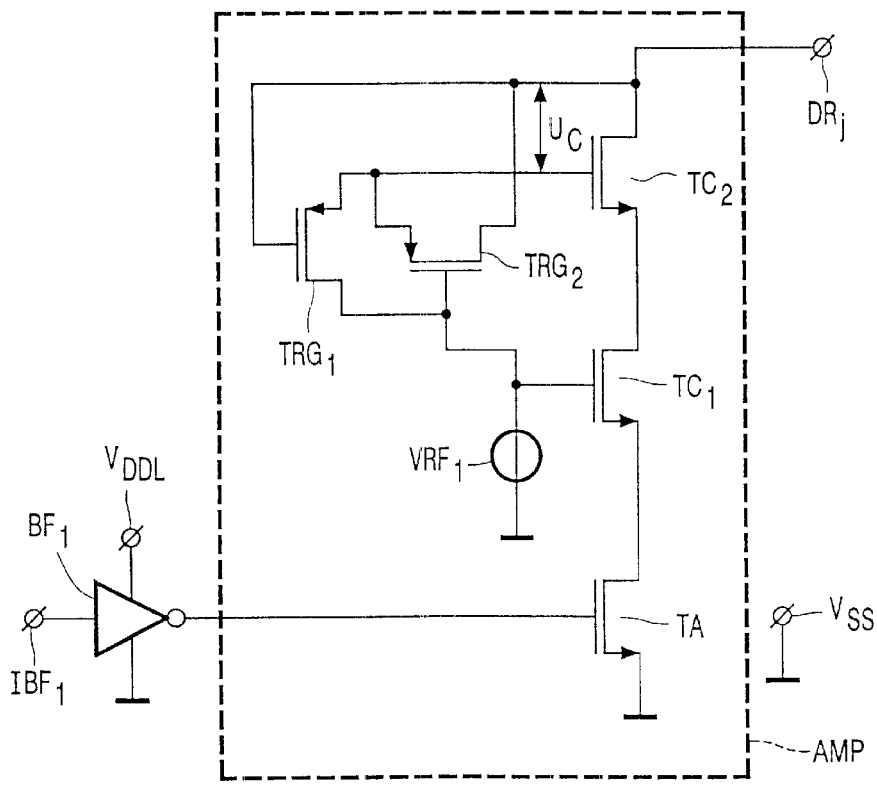
Figure 6:
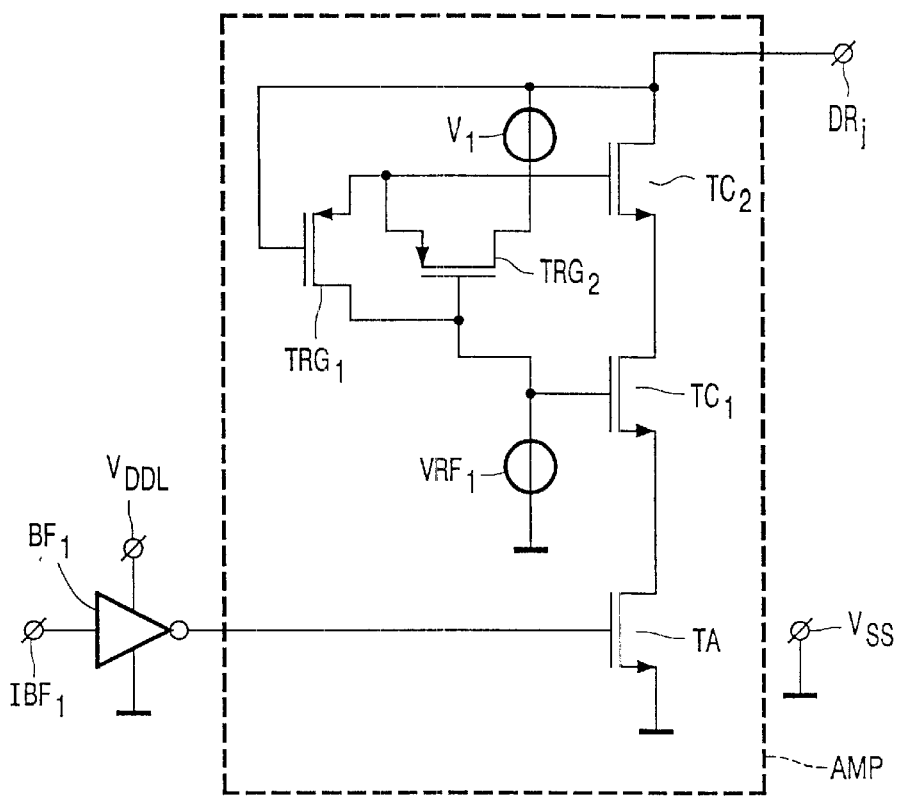
Figure 7:
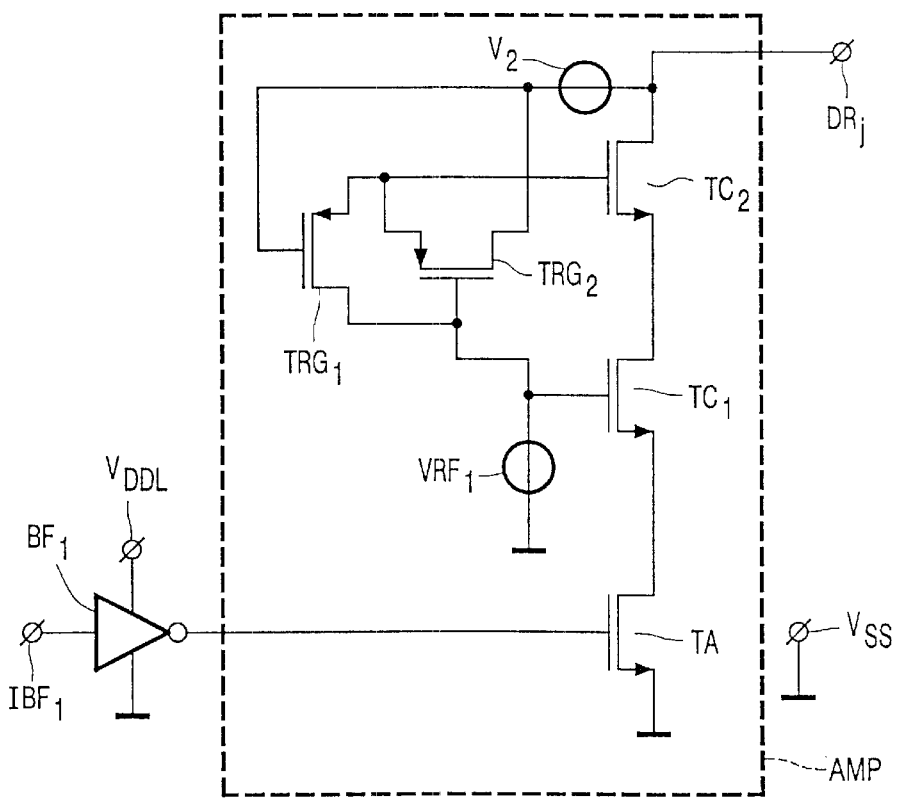

FIGS. 5, 6, and 7 are circuit diagrams of drivers which form alternatives for the driver shown in FIG. 4, the function of the transistor D connected as a diode being replaced by a first voltage regulation transistor TRG$_1$ and a second voltage regulation transistor TRG$_2$. The first voltage regulation transistor TRG$_1$ has a gate which is connected to the output DR$_j$, a source which is connected to the gate of the second cascode transistor TC$_2$, and a drain which is connected to the gate of the first cascode transistor TC$_1$. The second voltage regulation transistor TRG$_2$ has a gate which is connected to the gate of the first cascode transistor TC$_1$, a source which is connected to the gate of the second cascode transistor TC$_2$, and a drain which is connected to the output DR$_j$. Depending on the potential at the gate of the amplifier transistor TA and at the output DR$_j$, either the first voltage regulation transistor TRG$_1$ is conducting and the second voltage regulation transistor TRG$_2$ is non-conducting, or the first voltage regulation transistor TRG$_1$ is non-conducting and the second voltage regulation transistor TRG$_2$ is conducting, or both the first voltage regulation transistor TRG$_1$ and the second voltage regulation transistor TRG$_2$ are conducting. The control voltage U$_c$ is adapted in this manner such that the amplifier stage AMP does not contain any transistors across which a potential difference of more than 2.5 volts is present, while nevertheless the potential at the output DR$_j$ can be 5 volts.

Figure 8:
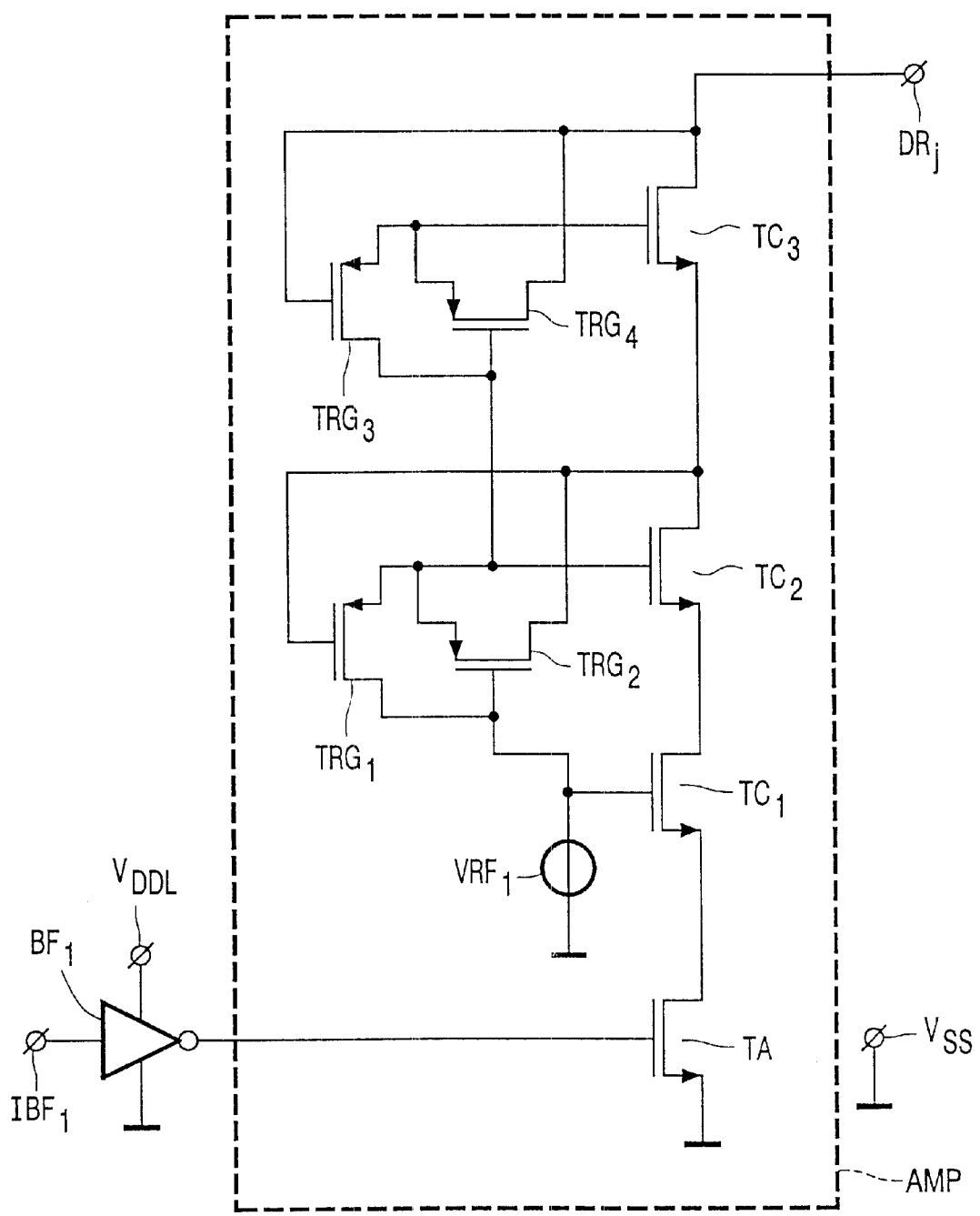

If the potential at the output DR$_j$ can be more than twice as high as the maximum admissible IC process voltage, the amplifier stage AMP may be augmented with an additional cascode transistor and additional voltage regulation transistors as shown by way of example in FIG. 8. If the potential at the output DR$_j$ is only slightly higher than twice the maximum admissible IC process voltage, a voltage level shifter may alternatively be used instead of the increase in the number of cascode transistors and voltage regulation transistors. This may be done, for example, in the manner shown in FIG. 6 with a voltage source V$_1$ in series with the drain of the second voltage regulation transistor TRG$_2$, or as shown in FIG. 7 with a voltage source V$_2$ in series with a common junction point of the gate of the first voltage regulation transistor TRG$_1$ and the drain of the second voltage regulation transistor TRG$_2$.

The circuit diagram of FIG. 8 forms an extension with respect to the circuit diagram of FIG. 5. A third cascode transistor TC$_3$ is connected in series between the drain of the second cascode transistor TC$_2$ and the output DR$_j$. The circuit further comprises a third voltage regulation transistor TRG$_3$ and a fourth voltage regulation transistor TRG$_4$. The interconnections between the third voltage regulation transistor TRG$_3$, the fourth voltage regulation transistor TRG$_4$, and the third cascode transistor TC$_3$ correspond to the interconnections between the first voltage regulation transistor TRG$_1$, the second voltage regulation transistor TRG$_2$, and the second cascode transistor TC$_2$, with the proviso that the gate of the fourth voltage regulation transistor TRG$_4$ and the drain of the third voltage regulation transistor TRG$_3$ are connected to the gate of the second cascode transistor $TC_2$ instead of to the gate of the first cascode transistor TC. The amplifier stage AMP may be adapted so as to cope with the potential at the output $DR_j$ in a similar manner by means of any number of additional cascode transistors and additional voltage regulation transistors, as the case requires.

Figure 9:
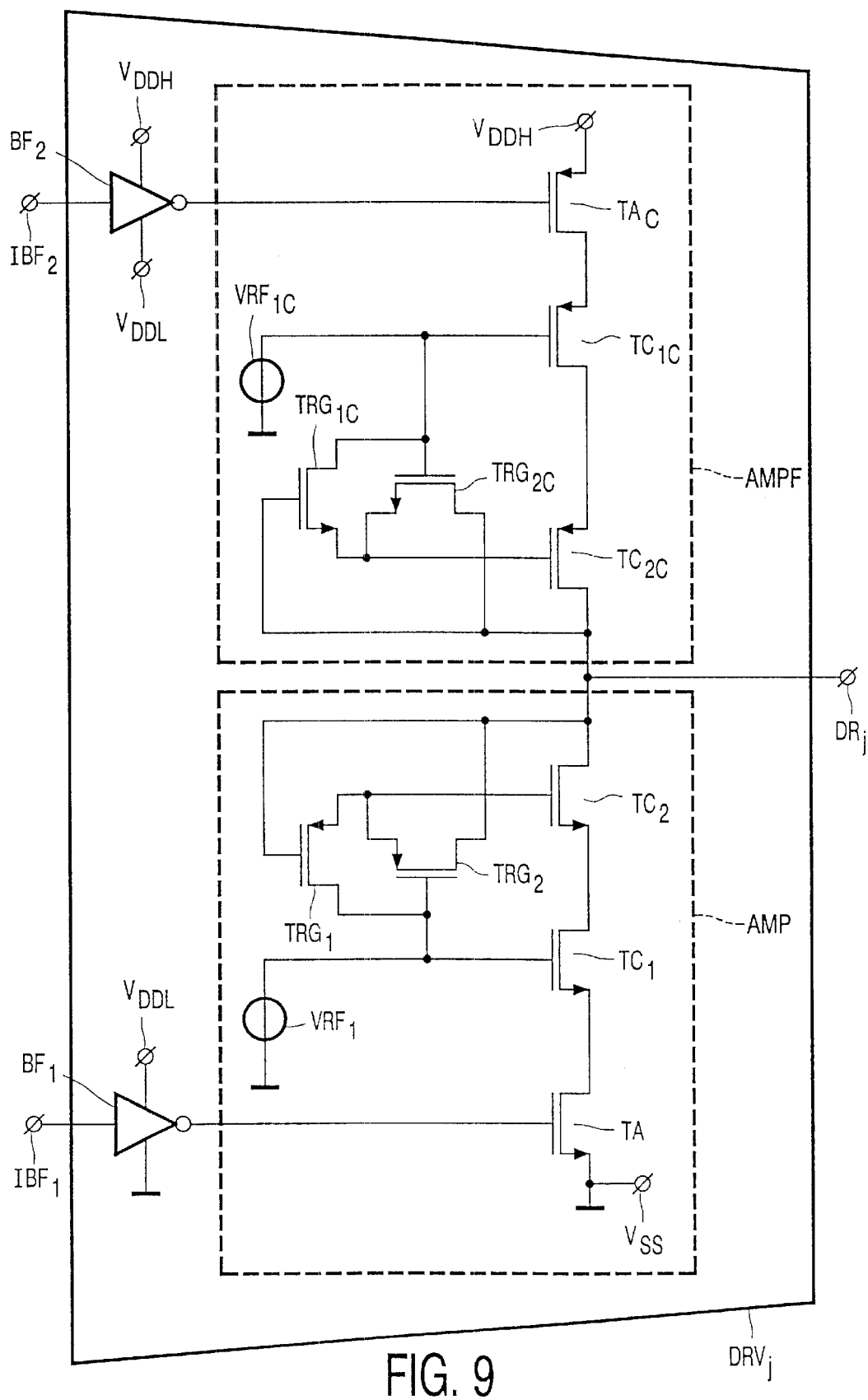

FIG. 9 is a circuit diagram corresponding to the circuit diagram of FIG. 3 and showing an embodiment of an amplifier stage AMP in accordance with FIG. 5, and showing an embodiment of a further amplifier stage AMPF, which further amplifier stage AMPF is implemented in a manner complementary to the circuit diagram of FIG. 5. The elements with reference symbols $TA_c$; $TC_{1c}$; $TC_{2c}$; $TRG_{1c}$; $TRG_2c$; and $VRF_{1c}$ correspond to elements having reference symbols TA; $TC_1$; $TC_2$; $TRG_1$; $TRG_2$; and $VRF_1$, respectively. It is not strictly necessary for the amplifier stage AMP and the further amplifier stage AMPF to be of a complementary construction. Thus it is possible, for example, that the amplifier stage AMP is constructed in accordance with the circuit diagram of FIG. 5 whereas the further amplifier stage AMPF is constructed as the complementary version of the circuit diagram of FIG. 4.

Figure 10:
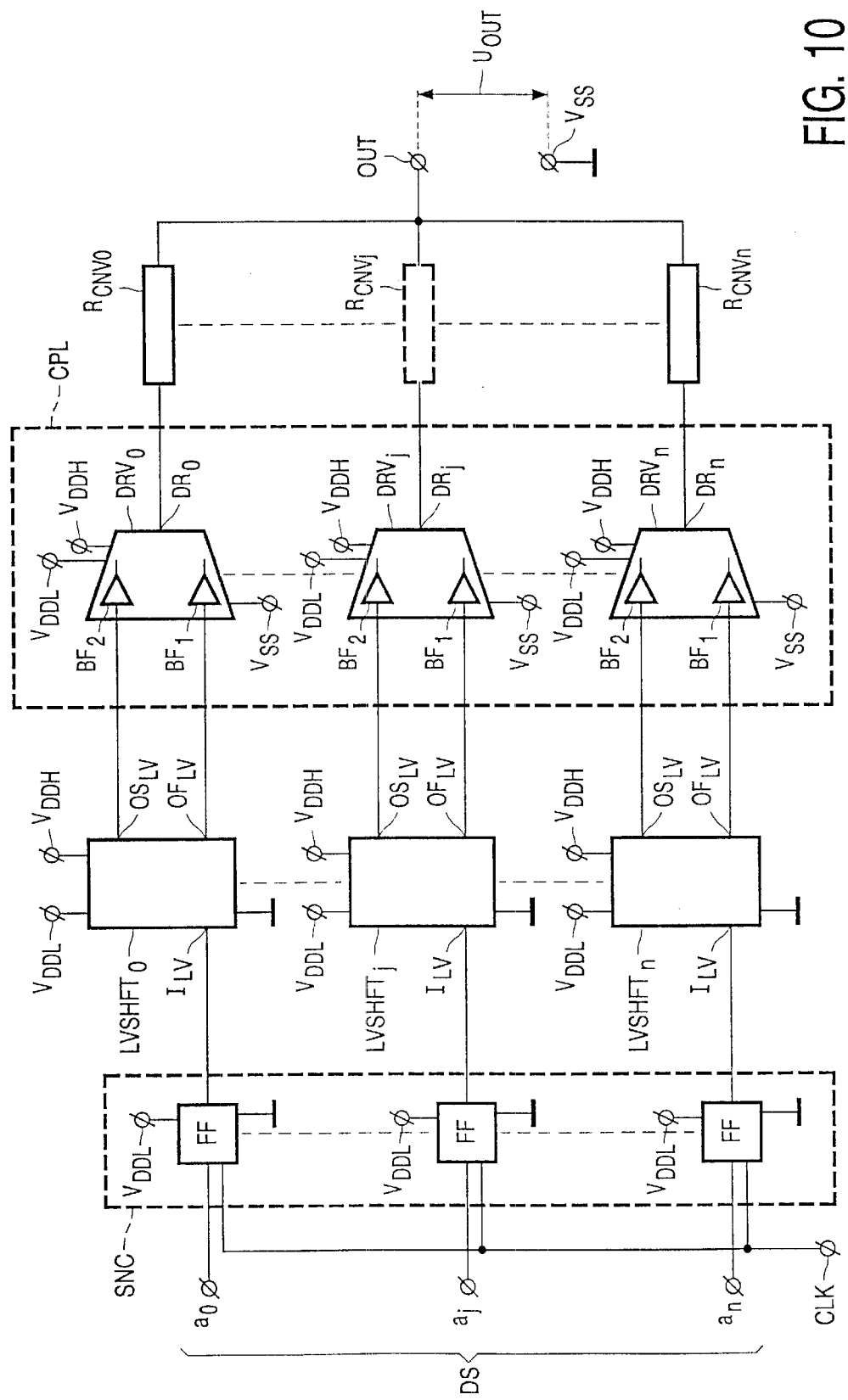
FIGS. 10 to 12 are circuit diagrams of further embodiments of an electronic circuit according to the invention.

FIG. 10 is a circuit diagram of a further embodiment of the electronic circuit according to the invention. The circuit of FIG. 10 comprises the circuit of FIG. 2 augmented with synchronization means SNC and level shifters $LVSHFT_0$ to $LVSHFT_n$. The synchronization means are formed by n flipflops FF. Each flipflop FF has a clock input which is connected to the terminal CLK for receiving a clock signal. Each flipflop FF has a separate data input which is coupled for receiving the associated data bit $a_j$. Each flipflop FF has a separate output which is coupled to the corresponding input $I_{LV}$ of the associated voltage level shifter $LVSHFT_j$. Each individual voltage level shifter $LVSHFT_j$ has a first output $OF_{LV}$ for coupling to the corresponding input of the first buffer $BF_1$ of the corresponding driver $DRV_j$, and a second output $OS_{LV}$ for coupling to the corresponding input of the second buffer $BF_2$ of the corresponding driver $DRV_j$. The synchronization means SNC ensure that the data bits $a_0$ to $a_n$ are clocked in substantially simultaneously, so that no undesirable intermediate levels can arise. The synchronization means are supplied from the first supply voltage $U_L$.

The voltage level shifters $LVSHFT_0$ to $LVSHFT_n$ are supplied both with the first supply voltage $U_L$ and with the second supply voltage $U_H$. Taking the example again of the first supply voltage $U_L$ being equal to 2.5 volts and the second supply voltage $U_H$ being equal to 5 volts, the voltage at the first output $OF_{LV}$ will vary between 0 and 2.5 volts, and the voltage at the second output $OS_{LV}$ will vary between 2.5 and 5 volts. In this manner there will be no components in the electronic circuit of FIG. 10 across which a potential difference of more than 2.5 volts is present.

Figure 11:
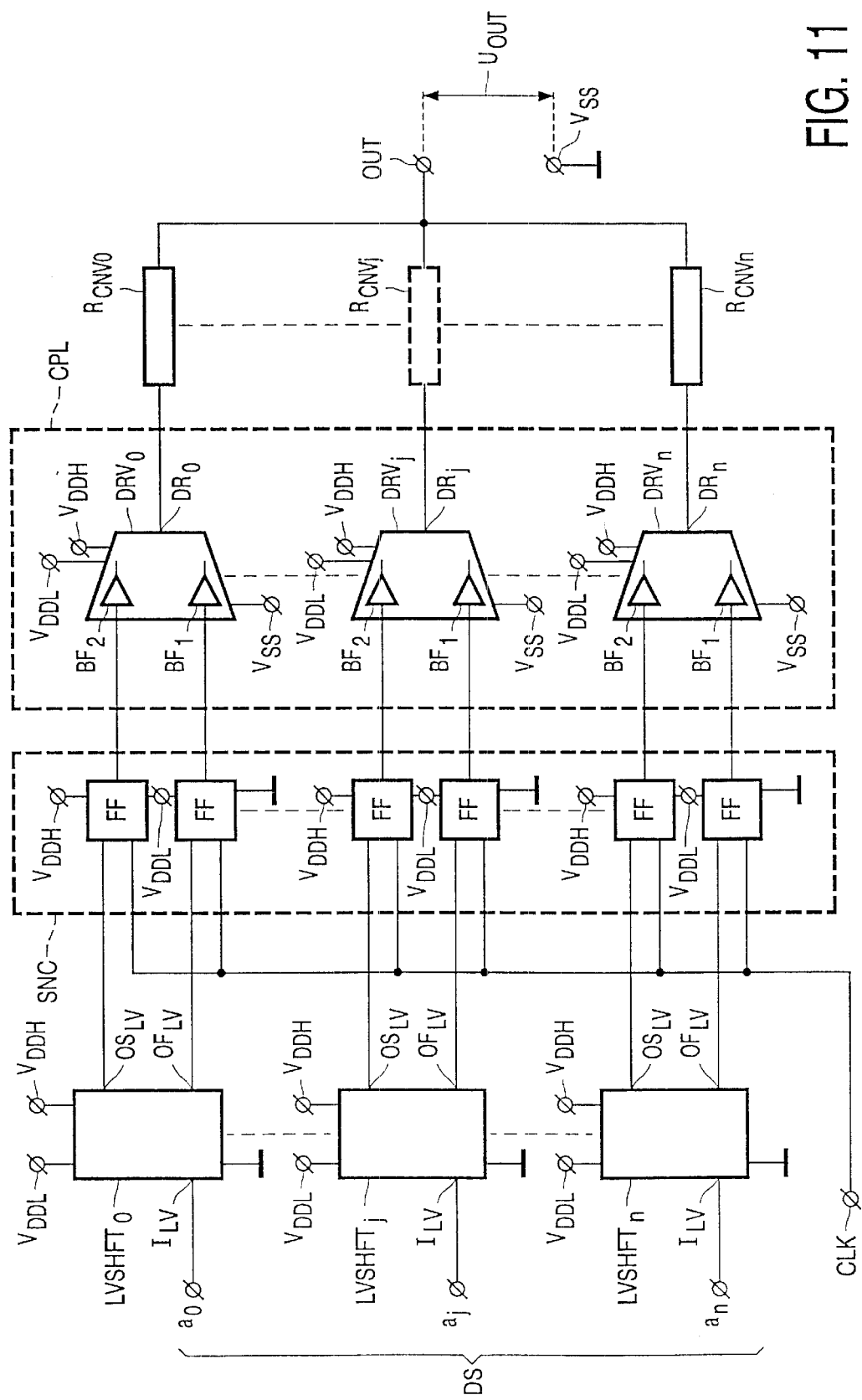

FIG. 11 is a circuit diagram of an embodiment of an electronic circuit according to the invention which forms an alternative to the electronic circuit of FIG. 10. The difference with FIG. 10 is mainly that the voltage levels of the data bits $a_n$ to $a_n$ are adapted first, and that subsequently the data bits are synchronized by the synchronization means SNC. To achieve this, the synchronization means are not supplied from the first supply voltage $U_L$, but from the second supply voltage $U_H$. The number of flipflops required is twice as high now.

Figure 12:
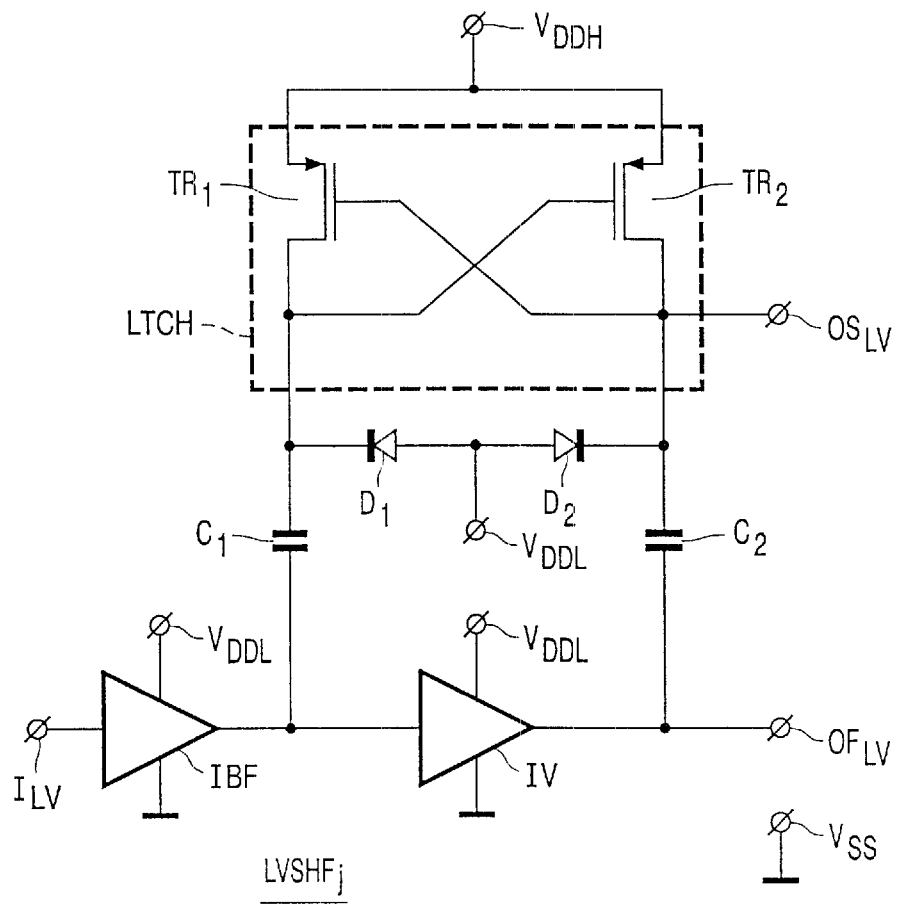

FIG. 12 is a circuit diagram of an embodiment of a voltage level shifter $LVSHFT_j$ according to the invention. The voltage level shifter $LVSHFT_j$ comprises an input buffer IBF, an inverter IV, a bistable trigger circuit LTCH formed by transistors $TR_1$ and $TR_2$, a first capacitor $C_1$, a second capacitor $C_2$, a first diode $D_1$, and a second diode $D_2$. The input buffer IBF and the inverter IV are supplied from the first supply voltage $U_L$. The input buffer IBF is shown as a non-inverting amplifier by way of example and has an input which forms the input $I_{LV}$ of the voltage level shifter $LVSHFT_j$ and an output which is connected to an input of the inverter IV. An output of the inverter IV is connected to the first output $OF_{LV}$ of the voltage level shifter $LVSHFT_j$. The sources of the transistors $TR_1$ and $TR_2$ are connected to the third supply connection terminal $V_{DDH}$ for receiving the second supply voltage $U_H$. The drain of the transistor $TR_1$ and the gate of the transistor $TR_2$ are interconnected and form the first trigger connection point. The drain of the transistor $TR_2$ and the gate of the transistor $TR_1$ are interconnected and form the second trigger connection point, which is also coupled to the second output $OS_{LV}$ of the voltage level shifter $LVSHFT_j$. The first capacitor $C_1$ is connected between the first trigger connection point and the output of the input buffer IBF. The second capacitor C2 is connected between the second output $OS_{LV}$ and the first output $OF_{LV}$ of the voltage level shifter $LVSBT_j$. The first diode $D_1$ is connected between the second supply connection terminal $V_{DDL}$ and the first trigger connection point. The second diode $D_1$ is connected between the second supply connection terminal $V_{DDL}$ and the first output $OS_{LV}$ of the voltage level shifter $LVSHFT_j$. During operation, and in the unsettled state, a DC voltage obtains across the capacitors $C_1$ and $C_2$ which effects the actual voltage level shift. The diodes $D_1$ and $D_2$ ensure that voltages in excess of the voltage delivered from the first supply voltage $U_L$ can never arise across the transistors $TR_1$ and $TR_2$ during starting of the first and second voltages $U_L$ and $U_H$.

Figure 13:
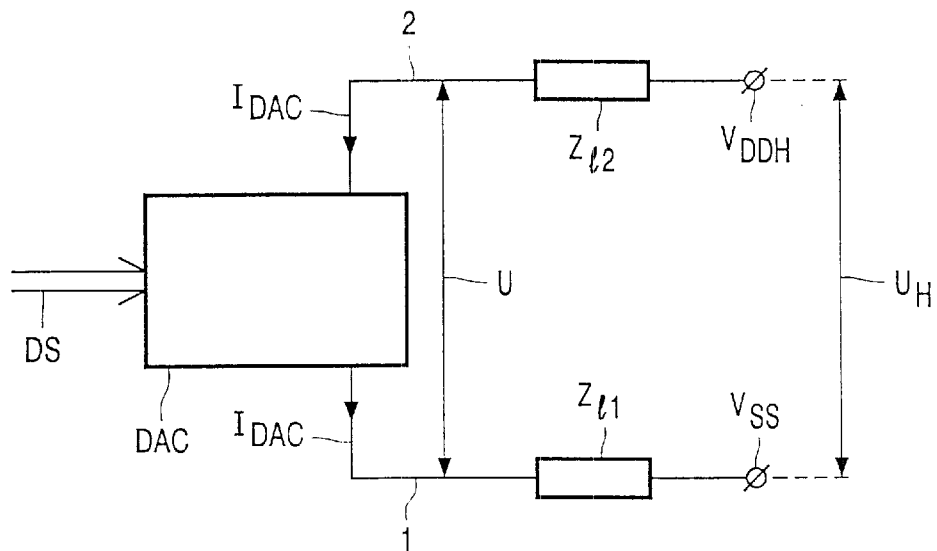
FIG. 13 is a simplified circuit diagram in which the parasitic wiring impedances to the supply connection points of a DA converter according to the invention are symbolically indicated.

FIG. 13 shows an electronic circuit with a DA converter DAC according to the invention. A first supply connection point 1 of the DA converter DAC is connected to the first supply connection terminal $V_{SS}$ of the electronic circuit. A second supply connection point 2 of the DA converter DAC is connected to the third supply connection terminal $V_{DDH}$ of the electronic circuit. The second supply voltage $U_H$ is connected between the first supply connection terminal $V_{SS}$ and the third supply connection terminal $V_{DDH}$. Parasitic wiring impedances between the connection point 1 and the first supply connection terminal $V_{SS}$ and between the connection point 2 and the third supply connection terminal $V_{DDH}$ are referenced $Z_{11}$ and $Z_{12}$, respectively. The current consumption $I_{DAC}$ of the DA converter DAC contains a component which is dependent on the digital input signal DS. Owing to the wiring impedances $Z_{11}$ and $Z_{12}$ which are present, an effective supply voltage U now arises with a component which is dependent on the digital input signal DS. If the DA converter DAC has an insufficiently high Power Supply Rejection Ratio, a signal distortion will arise, and possibly a signal crosstalk to other parts of the electronic circuit, owing to the data-dependent component in the effective supply voltage.

Figure 14:
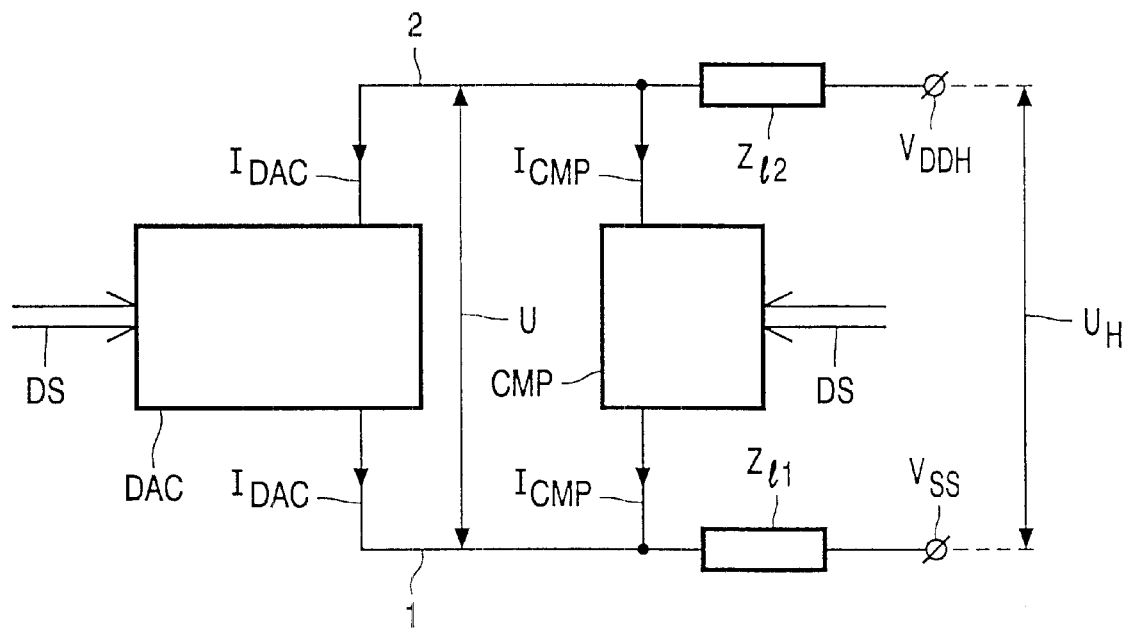
FIGS. 14 to 17 are circuit diagrams of further embodiment of an electronic circuit with a DA converter according to the invention which is provided with current compensation means according to the invention.

FIG. 14 shows an electronic circuit according to the invention with a DA converter DAC as shown in FIG. 13, with added thereto a current compensation circuit CMP. The digital signal DS is supplied not only to the DA converter, but also to the current compensation circuit CMP. The supply lines of the current compensation circuit CMP are not connected to the first supply connection terminal $V_{SS}$ and the third supply connection terminal $V_{DDH}$, but instead they are connected to the first connection point 1 and the second connection point 2, respectively. The current consumption of the current compensation circuit CMP is referenced $I_{CMP}$.

The value of $I_{CMP}$ preferably lies much lower than the value of $I_{DAC}$, so that the total current consumption of the circuit is not appreciably increased. However, the current compensation circuit CMP is designed such that the current consumption $I_{CMP}$ contains a data-dependent component which is as great as the data-dependent component of the current consumption $I_{DAC}$ of the DA converter DAC, but which is in opposite phase. As a result, the effective supply voltage U contains substantially no data-dependent component.

The electronic circuit of FIG. 14 will now be explained in more detail with reference to FIGS. 15, 16, and 17. In FIG. 17, the DA converter DAC is depicted as connected to the first supply connection point 1 and the second supply connection point 2, in contrast to FIG. 1. The DA converter DAC comprises switching means CPL and conversion resistors $R_{CNV0}$ to $R_{CNVn}$. The switching means CPL comprise switches which are controlled by the digital signals DS referenced $a_0$ to $a_n$. Depending on the logic values of the signals $a_0$ to $a_n$, the conversion resistors are connected either between the first connection point 1 and the output terminal OUT, or between the second supply connection point 2 and the output terminal OUT. FIG. 17 shows by way of example the situation in which the conversion resistors $R_{CNV0}$ and $R_{CNV1}$ are connected between the second supply connection point 2 and the output terminal OUT. The current consumption $I_{DAC}$ of the DA converter DAC is a minimum when all conversion resistors $R_{CNV0}$ to $R_{CNVn}$ are connected either between the first supply connection point 1 and the output terminal OUT or between the second supply connection point 2 and the output terminal OUT. The current consumption IDAC is greater in all other situations. The current consumption IDAC is a maximum when equal numbers of conversion resistors are connected between the first connection point 1 and the output terminal OUT and between the second supply connection point 2 and the output terminal OUT. It is assumed for this that all conversion resistors have substantially the same resistance value. The current consumption $I_{DAC}$ is thus dependent on the value of the digital signal DS. FIG. 16 shows an example of a current compensation circuit CMP which in this example comprises three compensation resistors referenced $R_{CMP1}$ to $R_{CMP3}$. The current compensation circuit further comprises switching means $S_{CMP}$ which are controlled by the digital signal DS. In dependence on the digital signal DS, a number of compensation resistors are or are not connected between the first supply connection point 1 and the second supply connection point 2. It is clear that the current consumption $I_{CMP}$ depends on the digital signal DS. As a result, the sum of the current consumption values $I_{DAC}$ and ICMP is constant, given a correct relative dimensioning of the DA converter DAC and the current compensation circuit CMP.

The following assumptions will now be made in order to clarify the manner of dimensioning. The output terminal OUT is unloaded, the number of conversion resistors as shown in FIG. 17 is 4, the number of compensation resistors as shown in FIG. 16 is 4, the supply voltage is 3 volts, and the value of each conversion resistor is 30 k$\Omega$. The value of the compensation resistors is 120 k$\Omega$. Two situations will now be reviewed.

In situation 1, two conversion resistors are connected between the first supply connection point 1 and the output terminal OUT, and two conversion resistors are connected between the second supply connection point 2 and the output terminal OUT. The output voltage $U_{OUT}$ is equal to 1.5 volts. The total resistance connected between the first supply connection point 1 and the second supply connection point 2 is equal to 30 k$\Omega$. The current consumption $I_{DAC}$ is equal to 100$\mu$A. At the same time there are three compensation resistors in the current compensation circuit CMP having a value of 120 k$\Omega$ and connected between the first supply connection point 1 and the second supply connection point 2. This makes the current consumption $I_{CMP}$ equal to 75$\mu$A. The sum of the current consumption values $I_{DAC}$ and $I_{CMP}$ is thus equal to 175$\mu$A.

In situation 2, one conversion resistor is connected between the second supply connection point 2 and the output terminal OUT, and three conversion resistors are connected between the first supply connection point 1 and the output terminal OUT. The output voltage $U_{OUT}$ is equal to 0.75 volt. The total resistance connected between the first supply connection point 1 and the second supply connection point 2 of the DA converter DAC is equal to 40 k$\Omega$. The current consumption $I_{DAC}$ is therefore equal to 75$\infty$A. At the same time there are four compensation resistors in the current compensation circuit CMP having a value of 120 k$\Omega$ and connected between the first supply connection point 1 and the second supply connection point 2. This makes the current consumption $I_{CMP}$ equal to 100 $\mu$A. The sum of the current consumption values $I_{DAC}$ and $I_{CMP}$ is thus equal to 175 $\mu$A.

It will be obvious from the above that the sum of the current consumption values $I_{DAC}$ and $I_{CMP}$ is constant and in this example is equal to 175 $\mu$A.

Figure 15:
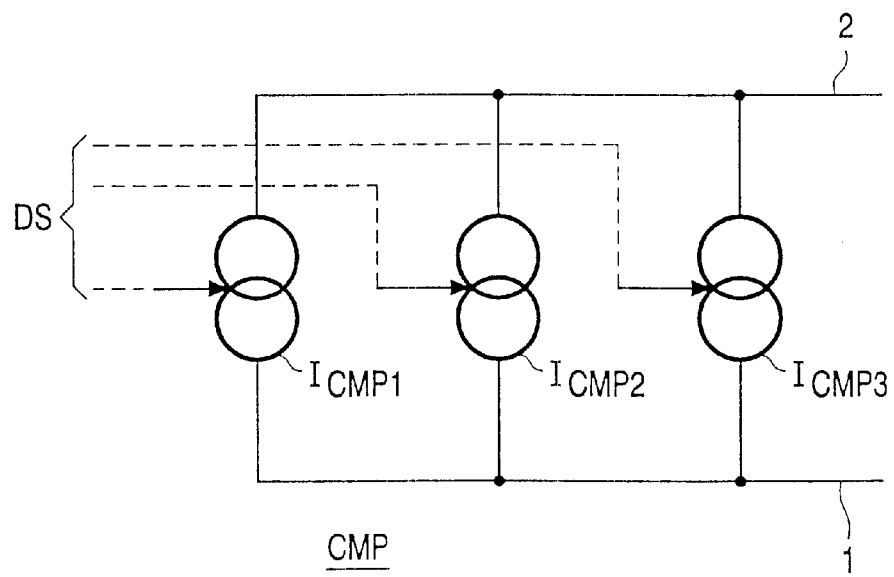
Figure 16:
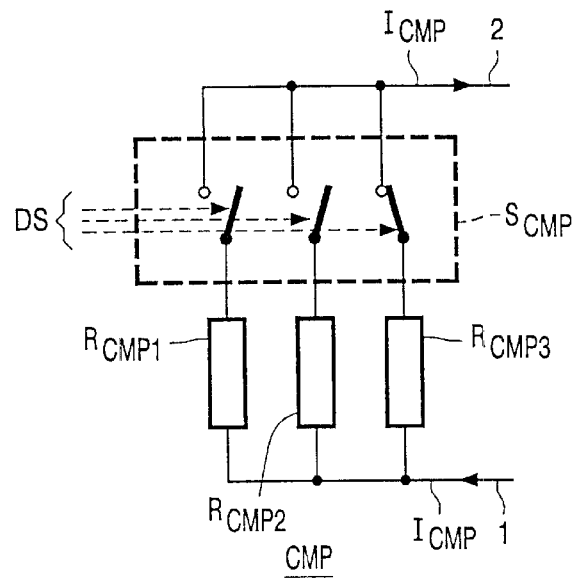
Figure 17:
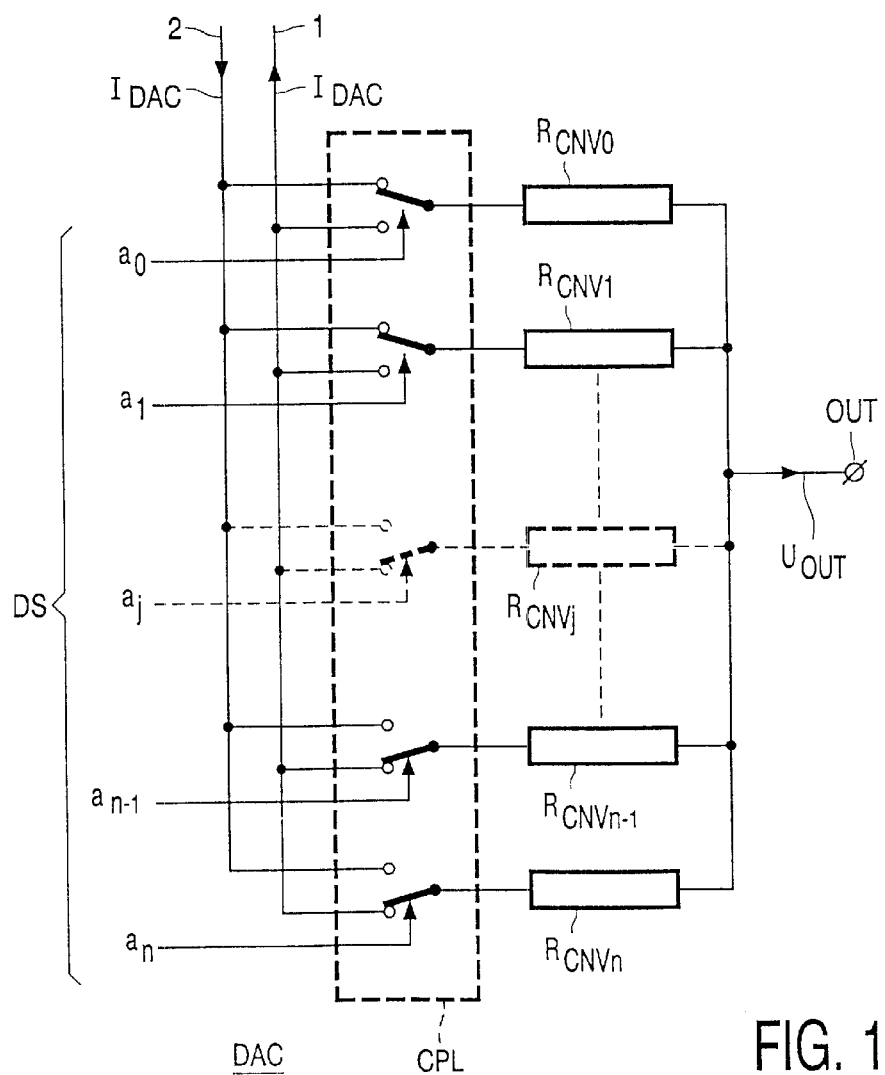

Instead of a current compensation circuit CMP with resistors as shown in FIG. 16, a current compensation circuit CMP with current sources as shown in FIG. 15 may alternatively be used. FIG. 15 shows by way of example three compensation current sources $I_{CMP1}$ to $I_{CMP3}$ which are connected between the first supply connection point 1 and the second supply connection point 2. Depending on the data content of the digital signal DS, the compensation current sources deliver a certain reference current, or one or several of these compensation current sources are switched off.

As an alternative to the current compensation circuit CMP shown in FIG. 15, it is possible to switch on only one of the compensation current sources $I_{CMP1}$ to $I_{CMP3}$ at a time, the value of the current supplied by the one switched-on compensation current source $I_{CMP1}$–$I_{CMP3}$ being dependent on the data content of the digital signal DS, instead of having the number of switched-on compensation current sources $I_{CMP1}$–$I_{CMP3}$ depend on the data content of the digital signal DS.

As an alternative to the current compensation circuit CMP shown in FIG. 15, it is possible to connect only one of the compensation resistors $R_{CMP1}$ to $R_{CMP3}$ at a time between the first supply connection point 1 and the second supply connection point 2, the value of the one connected compensation resistor $R_{CMP1}$–$R_{CMP3}$ being dependent on the data content of the digital signal DS, instead of having the number of compensation resistors $R_{CMP1}$–$R_{CMP3}$ connected between the first supply connection point 1 and the second supply connection point 2 depend on the data content of the digital signal DS.

The electronic circuit may be implemented with discrete components as well as in an integrated circuit. Transistors may be used for the current sources, for example bipolar transistors or field effect transistors.

What is claimed is:

1. An electronic circuit designed for receiving a first supply voltage ($U_L$) between a first supply connection terminal ($V_{SS}$) and a second supply connection terminal ($V_{DDL}$) and for receiving a second supply voltage ($U_H$) between the first supply connection terminal ($V_{SS}$) and a third supply connection terminal ($V_{DDH}$), comprising a DA converter (DAC) for converting a digital signal (DS) with a voltage range which is at most equal to the first supply voltage ($U_L$) into an analog signal ($U_{OUT}$) with a voltage range which is at most equal to the second supply voltage ($U_H$), characterized in that the DA converter (DAC) comprises:

conversion resistors ($R_{CNV0}$–$R_{CNVn}$) and coupling means (CPL) for coupling a number of said conversion resistors ($R_{CNV2}$–$R_{CNVn}$) between the first supply connection terminal ($V_{SS}$) and an Do output terminal (OUT) of the DA converter (DAC), and for coupling the remaining number of conversion resistors ($R_{CNV0}$, $R_{CNV1}$) between the third supply terminal ($V_{DDH}$) and the output terminal (OUT), said number being dependent on the data content of the digital signal (DS).

2. An electronic circuit as claimed in claim 1, characterized in that the coupling means (CPL) comprise drivers ($DRV_0$–$DRV_n$) which are coupled between the first supply connection terminal ($V_{SS}$) and the third supply connection terminal ($V_{DDH}$), and in that each conversion resistor ($R_{CNVj}$) is coupled by a first connection point to the output terminal (OUT) and by a second connection point separately to an output ($DR_j$) of the associated separate driver ($DRV_j$).

3. An electronic circuit as claimed in claim 2, characterized in that each driver ($DRV_j$) comprises: a cascoded amplifier stage (AMP) with at least one cascode transistor, and voltage supply means for supplying a control voltage ($U_C$) between a control electrode and a main electrode of at least one cascode transistor, which control voltage ($U_C$) has a value which is dependent on the value of the voltage at the output of the relevant separate driver ($DRV_j$).

4. An electronic circuit as claimed in claim 3, characterized in that the amplifier stage (AMP) comprises: an amplifier transistor (TA), a first cascode transistor ($TC_1$), and a second cascode transistor ($TC_2$), and in that a first main electrode of the amplifier transistor (TA) is coupled to the first supply connection terminal ($V_{SS}$) or to the third supply connection terminal ($V_{DDH}$), and in that the main current path of the first cascode transistor is coupled between a second main electrode of the amplifier transistor (TA) and a first main electrode of the second cascode transistor ($TC_2$), and in that a control electrode of the first cascode transistor ($TC_1$) is connected so as to receive a reference voltage ($VRF_1$), and in that a second main electrode of the second cascode transistor ($TC_2$) is coupled to the output ($DR_j$) of the relevant separate driver ($DRV_0$–$DRV_n$), and in that said voltage supply means deliver said control voltage ($U_c$) between a control electrode of the second cascode transistor ($TC_2$) and the first main electrode of the second cascode transistor ($TC_2$).

5. An electronic circuit as claimed in claim 4, characterized in that said voltage supply means comprise a transistor connected as a diode (D) which is coupled in parallel to the main current path of the second cascode transistor ($TC_2$).

6. An electronic circuit as claimed in claim 4, characterized in that the second cascode transistor ($TC_2$) is constructed with a field effect transistor of a first conductivity type, and in that said voltage supply means comprise: a first voltage regulation transistor ($TRG_1$) which is constructed with a field effect transistor of a second conductivity type and a second voltage regulation transistor ($TRG_2$) which is constructed with a field effect transistor of the second conductivity type, a first main electrode of the first voltage regulation transistor ($TRG_1$) being coupled to the control electrode of the second cascode transistor ($TC_2$), a control electrode of the first voltage regulation transistor ($TRG_1$) being coupled to the control electrode of the second voltage regulation transistor ($TRG_2$), a second main electrode of the first voltage regulation transistor ($TRG_1$) being coupled to the control electrode of the first cascode transistor $TC_1$), a first main electrode of the second voltage regulation transistor ($TRG_2$) being coupled to the control electrode of the second cascode transistor ($TC_2$), a second main electrode of the second voltage regulation transistor ($TRG_2$) being coupled to the second main electrode of the second cascode transistor ($TC_2$), and a control electrode of the second voltage regulation transistor ($TRG_2$) being coupled to the control electrode of the first cascode transistor ($TC_1$).

7. An electronic circuit as claimed in claim 6, characterized in that the amplifier (AMP) in addition comprises a voltage level shifter ($V_1$) which is connected in series with the second main electrode of the second voltage regulation transistor ($TRG_2$).

8. An electronic circuit as claimed in claim 6, characterized in that the amplifier (AMP) in addition comprises a voltage level shifter ($V_2$) which is connected in series between the common junction point of the control electrode of the first voltage regulation transistor ($TRG_1$) with the second main electrode of the second voltage regulation transistor ($TRG_2$) and the second main electrode of the second voltage regulation transistor ($TRG_2$).

9. An electronic circuit as claimed in claim 3, characterized in that each driver ($DRV_j$) in addition comprises a further amplifier stage (AMPF) which is designed so as to be complementary to the amplifier stage (AMP) in that the transistors of the further amplifier stage (AMPF) are of a conductivity type opposed to that of the corresponding transistors of the amplifier stage (AMP), and in that the amplifier stage is coupled between the first supply connection terminal ($V_{SS}$) and the output terminal OUT, and in that the further amplifier stage (AMPF) is coupled between the third supply connection terminal ($V_{DDH}$) and the output terminal OUT.

10. An electronic circuit as claimed in claim 9, characterized in that each driver ($DRV_j$) in addition comprises a first buffer ($BF_1$) with a first supply connection point which is coupled to the first supply connection terminal ($V_{SS}$), a second supply connection point which is coupled to the second supply connection terminal ($V_{DDL}$), an output which is coupled to the control electrode of the amplifier transistor (TA) of the amplifier stage (AMP), and an input ($IBF_1$); and a second buffer ($BF_2$) with a first supply connection point which is coupled to the second supply connection terminal ($V_{DDL}$), a second supply connection point which is coupled to the third supply connection terminal ($V_{DDH}$), an output which is coupled to the control electrode of the amplifier transistor ($TA_C$) of the further amplifier stage (AMPF), and an input ($IBF_2$).

11. An electronic circuit as claimed in claim 10, characterized in that the DA converter (DAC) comprises a separate digital voltage level shifter ($LVSHFT_j$) for each driver ($DRV_j$), with a first supply connection point which is coupled to the first supply connection terminal ($V_{SS}$), with a second supply connection point which is coupled to the second supply connection terminal ($V_{DDL}$), with a third supply connection point which is coupled to the third supply connection terminal ($V_{DDH}$), with a first output ($OF_V$) which is coupled to the input ($IBF_1$) of the first buffer($BF_1$), with a second output ($OS_V$) which is coupled to the input ($IBF_2$) of the second buffer($BF_2$), and with an input ($I_{LV}$), and in that the DA converter (DAC) in addition comprises synchronization means (SNC) for synchronizing the data bits ($a_0$–$a_n$) of the digital signal (DS), separate inputs of the synchronization means being coupled so as to receive the separate data bits ($a_0$–$a_n$), while the synchronization means (SNC) have a clock input (CLK) for receiving a clock signal, and the synchronization means (SNC) have separate outputs which are coupled to the separate inputs ($I_{LV}$) of the separate digital voltage level shifters (LVSHFT$_0$ _LVSHFT$_n$).

12. An electronic circuit as claimed in claim 10, characterized in that the DA converter (DAC) comprises a separate digital voltage level shifter (LVSHFT$_j$) for each driver (DRV$_j$), with a first supply connection point which is coupled to the first supply connection terminal ($V_{SS}$), with a second supply connection point which is coupled to the second supply connection terminal ($V_{DDL}$), with a third supply connection point which is coupled to the third supply connection terminal ($V_{DDH}$), with a first output (OF$_{LV}$), with a second output (OS$_{LV}$), and with an input (IL$_v$), the separate inputs ($I_{LV}$) of the voltage level shifters (LVSHFT$_0$_ LVSHFT$_n$) being coupled so as to receive the separate data bits ($a_0$–$a_n$) of the digital signal (DS), and in that the DA converter (DAC) in addition comprises synchronization means (SNC) for synchronizing the data bits ($a_0$–$a_n$), separate inputs of the synchronization means being coupled to the separate first outputs (OF$_{LV}$) and the separate second outputs (OS$_{LV}$) of the voltage level shifters (LVSHFT$_0$_ LVSHFT$_n$), which synchronization means (SNC) have a clock input (CLK) for receiving a clock signal, and which synchronization means (SNC) have separate outputs which are coupled to the separate first inputs (IBF$_1$) of the first buffers (BF$_1$) and the separate second inputs (IBF$_2$) of the second buffers (BF$_2$).

13. An electronic circuit as claimed in claim 11, characterized in that the voltage level shifter (LVSHFT$_j$) comprises: an input buffer (IBF) with a first supply connection point which is coupled to the first supply connection terminal ($V_{SS}$), a second supply connection point which is coupled to the second supply connection terminal ($V_{DDL}$), an input which forms the input (IBF) of the voltage level shifter (LVSHFT$_j$), and an output; an inverter (IV) with a first supply connection point which is coupled to the first supply connection terminal ($V_{SS}$), a second supply connection point which is coupled to the second supply connection terminal ($V_{DDL}$), an input which is coupled to the output of the input buffer (IBF), and an output which forms the first output (OF$_{LV}$) of the voltage level shifter (LVSHFT$_j$); a bistable trigger circuit (LTCH) with a supply connection point which is coupled to the third supply connection terminal ($V_{DDH}$), a first trigger connection point, and a second trigger connection point which forms the second output (OS$_{LV}$) of the voltage level shifter (LVSHFT$_j$); a first capacitive element (C$_1$) which is coupled between the first trigger connection point and the output of the input buffer (IBF); and a second capacitive element (C$_2$) which is coupled between the second trigger connection point and the output of the inverter (IV).

14. An electronic circuit as claimed in claim 13, characterized in that the voltage level shifter (LVSHFT$_j$) further comprises limitation means for limiting the potential difference between the third supply connection terminal ($V_{DDH}$) and the first trigger connection point and for limiting the potential difference between the third supply connection terminal ($V_{DDH}$) and the second trigger connection point.

15. An electronic circuit as claimed in claim 14, characterized in that said limitation means comprise a first element (D$_1$) with a diode function which is coupled between the first trigger connection point and the second supply connection terminal ($V_{DDL}$), and a second element (D$_2$) with a diode function which is coupled between the second trigger connection point and the second supply connection terminal ($V_{DDL}$).

16. An electronic circuit as claimed in claim 15, characterized in that the first element (D$_1$) is constructed as a field effect transistor connected as a diode, and the second element (D$_2$) is constructed as a field effect transistor connected as a diode.

17. An electronic circuit as claimed in claim 1, characterized in that the conversion resistors (R$_{CNV0}$–R$_{CNVn}$) are manufactured from a material whose main ingredient is polycrystalline silicon.

18. An electronic circuit as claimed in claim 1, characterized in that the electronic circuit comprises a current compensation circuit (CMP) which is connected between the first supply connection terminal (V$_{SS}$) and the third supply connection terminal (V$_{DDH}$) for receiving the second supply voltage (U$_H$), which current compensation circuit (CMP) in the operational state is controlled from the digital signal (DS) in a manner such that the sum of the current consumption (I$_{DAC}$) of the DA converter (DAC) and the current consumption (ICMP) of the current compensation circuit (CMP) is substantially independent of the data content of the digital signal (DS).

19. An electronic circuit as claimed in claim 18, characterized in that the current compensation circuit (CMP) comprises compensation current sources (I$_{CMP1}$–I$_{CMP3}$) which are coupled between the first supply connection terminal (V$_{SS}$) and the third supply connection terminal (V$_{DDH}$), such that in the operational state a number of said compensation current sources (I$_{CMP3}$) is switched on, said number depending on the data content of the digital signal (DS).

20. An electronic circuit as claimed in claim 18, characterized in that the current compensation circuit (CMP) comprises compensation resistors (R$_{CMP1}$–R$_{CMP3}$), a number of said compensation resistors (R$_{CMP3}$) being coupled between the first supply connection terminal (V$_{SS}$) and the third supply connection terminal (V$_{DDH}$) in the operational state, said number being dependent on the data content of the digital signal (DS).

21. An electronic circuit as claimed in claim 18, characterized in that the current compensation circuit (CMP) comprises compensation current sources (I$_{CMP1}$–I$_{CMP3}$) which are coupled between the first supply connection terminal (V$_{SS}$) and the third supply connection terminal (V$_{DDH}$), such that in the operational state one of said compensation current sources (I$_{CMP1}$–I$_{CMP3}$) is switched on, the value of the current supplied by the one switched-on compensation current source (I$_{CMP1}$–I$_{CMP3}$) being dependent on the data content of the digital signal (DS).

22. An electronic circuit as claimed in claim 18, characterized in that the current compensation circuit (CMP) comprises compensation resistors (R$_{CMP1}$–R$_{CMP3}$), such that in the operational state one of said compensation resistors (R$_{CMP1}$–R$_{CMP3}$) is coupled between the first supply connection terminal (V$_{SS}$) and the third supply connection terminal (V$_{DDH}$), the resistance value of said one compensation resistor (R$_{CMP1}$–R$_{CMP3}$) being dependent on the data content of the digital signal (DS).

* * * * *